United States Patent
Ruan et al.

(10) Patent No.: US 11,463,002 B2
(45) Date of Patent: Oct. 4, 2022

(54) SWITCH-MODE POWER SUPPLY CIRCUIT

(71) Applicant: TEXAS INSTRUMENTS INCORPORATED, Dallas, TX (US)

(72) Inventors: Jiancong Ruan, Shenzhen (CN); Runqin Tan, Shenzhen (CN); Peisheng Zhu, Shenzhen (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 316 days.

(21) Appl. No.: 16/654,132

(22) Filed: Oct. 16, 2019

(65) Prior Publication Data

US 2020/0373837 A1    Nov. 26, 2020

Related U.S. Application Data

(60) Provisional application No. 62/852,436, filed on May 24, 2019.

(51) Int. Cl.
*H02M 3/158* (2006.01)
*G01R 21/133* (2006.01)
*H02M 1/44* (2007.01)

(52) U.S. Cl.
CPC ......... *H02M 3/158* (2013.01); *G01R 21/133* (2013.01); *H02M 1/44* (2013.01)

(58) Field of Classification Search
CPC ........ H02M 3/158; H02M 1/44; H02M 3/003; H02M 1/12; G01R 21/133
See application file for complete search history.

(56) References Cited

U.S. PATENT DOCUMENTS

| | | | | |
|---|---|---|---|---|
| 5,805,439 | A * | 9/1998 | Kruppa | H02M 3/156 363/142 |
| 7,268,526 | B1 * | 9/2007 | Smith | H02M 3/156 323/284 |
| 2002/0125871 | A1 * | 9/2002 | Groom | H02M 3/156 323/284 |
| 2008/0259654 | A1 * | 10/2008 | Huynh | H02M 3/33523 363/21.16 |
| 2011/0110123 | A1 * | 5/2011 | Li | H02M 3/33523 363/21.17 |
| 2014/0117955 | A1 * | 5/2014 | Zoso | H02M 3/157 323/271 |
| 2017/0359060 | A1 * | 12/2017 | Godycki | H03K 17/74 |

FOREIGN PATENT DOCUMENTS

WO    WO-2008055507 A1 *    5/2008    ............. G01R 22/06

OTHER PUBLICATIONS

Texas Instruments. "TPS56339 4.5-V to 24-V Input, 3-A Output Synchronous Buck Converter." SLVSE12A—Nov. 2018—Revised May 2019. pp. 1-32.

* cited by examiner

*Primary Examiner* — Raul J Rios Russo
*Assistant Examiner* — Carl F. R. Tchatchouang
(74) *Attorney, Agent, or Firm* — Ray A. King; Charles A. Brill; Frank D. Cimino

(57) ABSTRACT

A switch-mode power supply circuit includes a feedback terminal, a control circuit, a comparator, and a switch. The comparator includes a first input terminal coupled to a reference voltage source, and an output terminal coupled to an input terminal of the control circuit. The switch includes a first terminal coupled to the feedback terminal, a second terminal coupled to a second input terminal of the comparator, and a third terminal coupled to an output terminal of the control circuit.

21 Claims, 7 Drawing Sheets

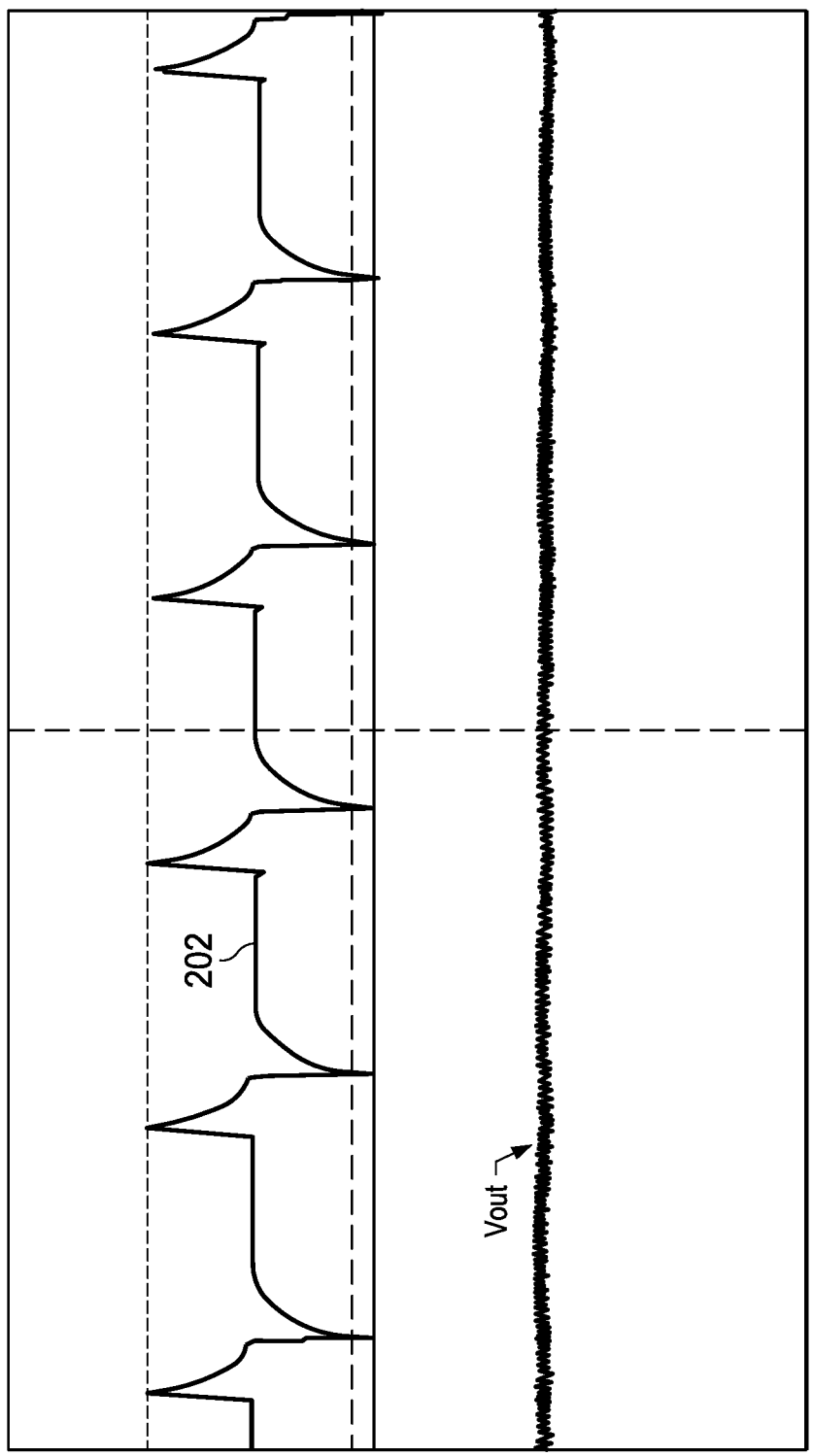

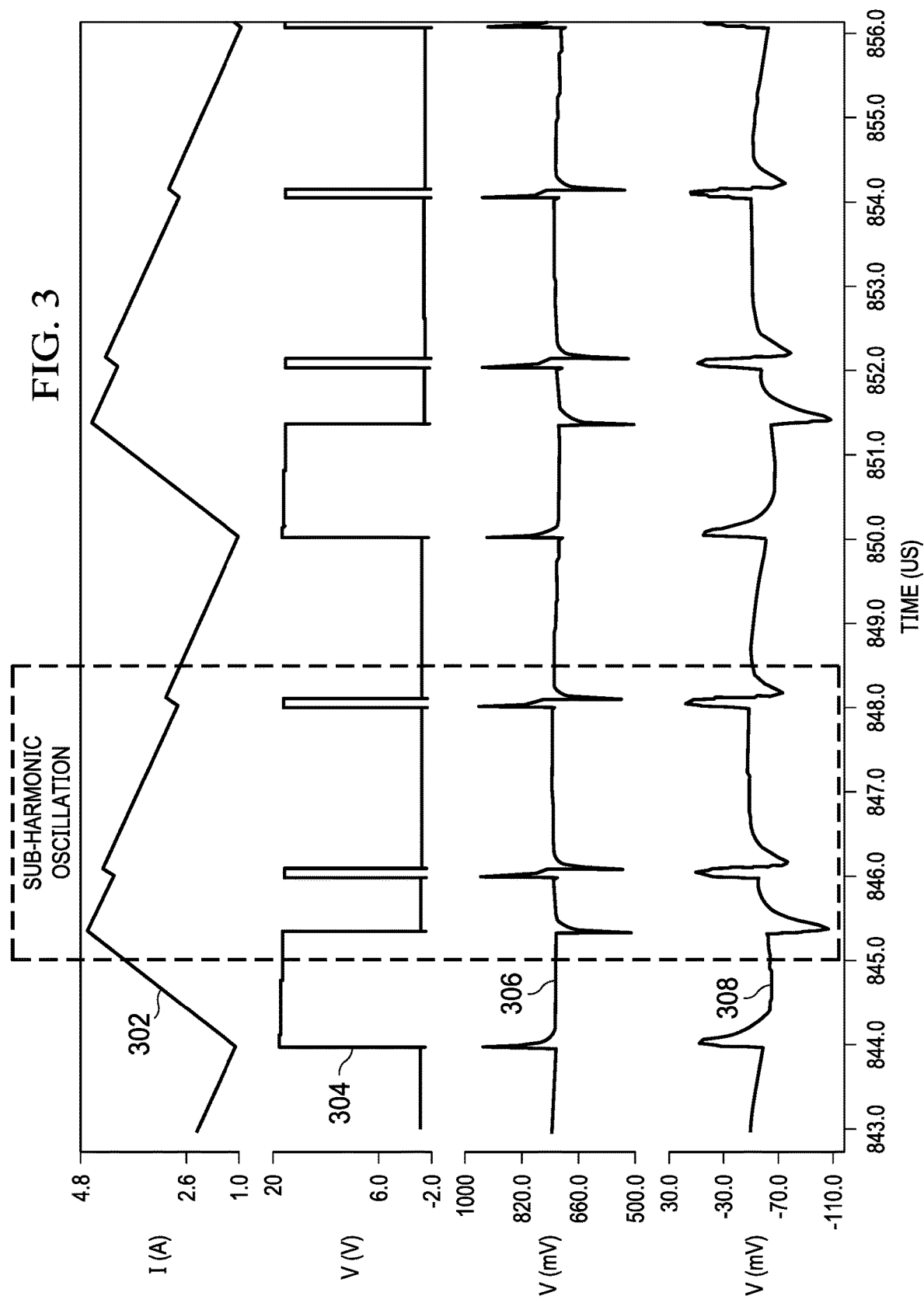

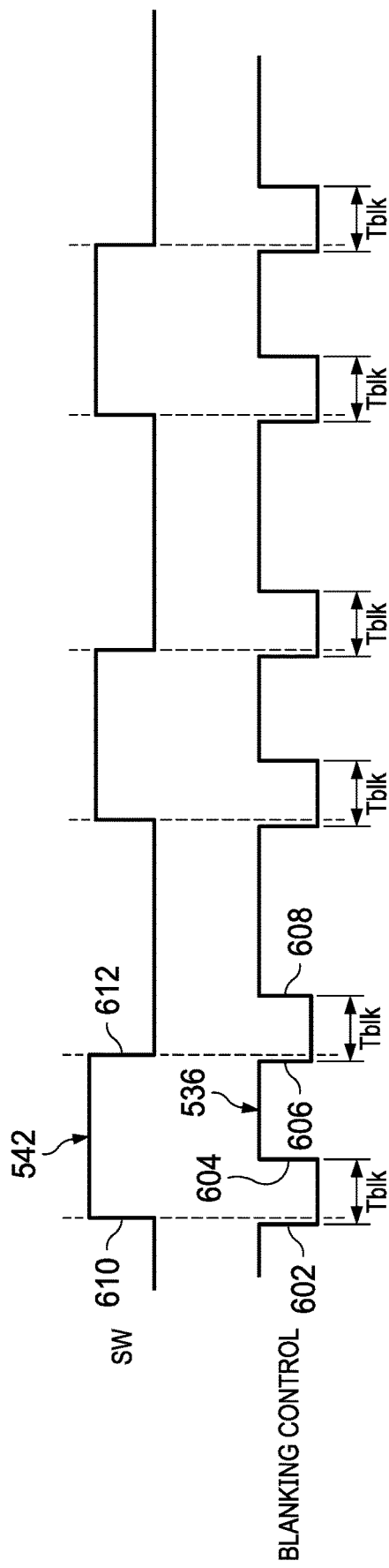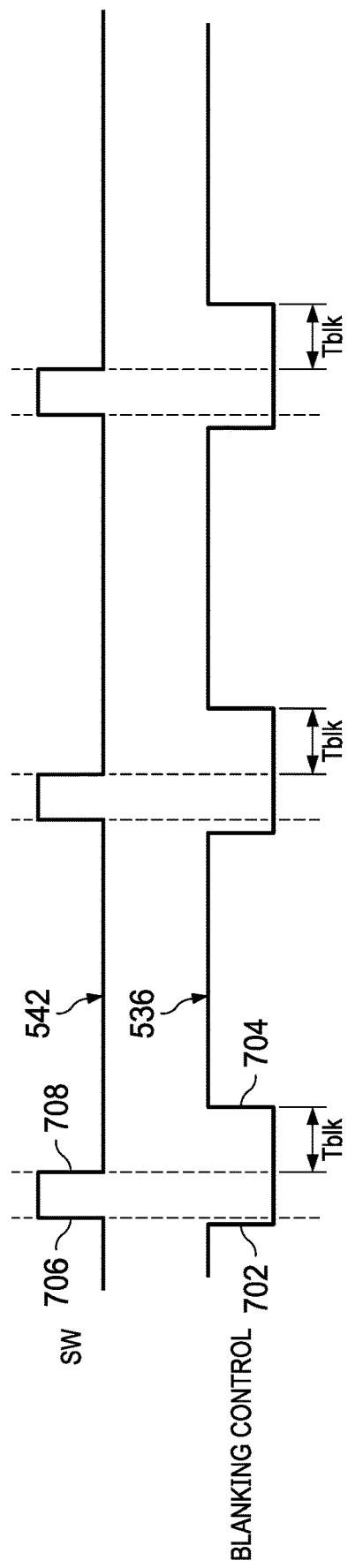

SWITCH-MODE POWER SUPPLY CIRCUIT

CROSS-REFERENCE TO RELATED APPLICATIONS

The present application claims priority to U.S. Provisional Patent Application No. 62/852,436, filed May 24, 2019, entitled "A DC-DC Converter with Improved Noise Immunity," which is hereby incorporated herein by reference in its entirety.

BACKGROUND

A switch-mode power supply is an electronic circuit that converts an input direct current (DC) supply voltage into one or more DC output voltages that are higher or lower in magnitude than the input DC supply voltage. A switch-mode power supply that generates an output voltage lower than the input voltage is termed a buck or step-down converter. A switch-mode power supply that generates an output voltage higher than the input voltage is termed a boost or step-up converter.

Some switch-mode power supply topologies include a drive/power transistor coupled at a switch node to an energy storage inductor/transformer. Electrical energy is transferred through the energy storage inductor/transformer to a load by alternately opening and closing the switch as a function of a switching signal. The amount of electrical energy transferred to the load is a function of the ON/OFF duty cycle of the switch and the frequency of the switching signal. Switch-mode power supplies are widely used in electronic devices, particularly battery powered devices, such as portable cellular phones, laptop computers, and other electronic systems in which efficient use of power is desirable.

SUMMARY

A switch-mode power supply circuit that reduces undesirable effects of switching noise during circuit operation by blanking feedback voltage during transistor switching is disclosed herein. In one example, a switch-mode power supply circuit includes a feedback terminal, a control circuit, a comparator, and a switch. The comparator includes a first input terminal coupled to a reference voltage source, and an output terminal coupled to the control circuit. The switch includes a first terminal coupled to the feedback terminal, a second terminal coupled to a second input terminal of the comparator, and a third terminal coupled to the control circuit.

In another example, a switch-mode power supply circuit includes a feedback terminal, a comparator, a switch, and a control circuit. The feedback terminal is configured to receive a feedback signal. The comparator is configured to compare the feedback signal to a reference signal. The switch is coupled to the feedback terminal and the comparator, and is configured to pass the feedback signal from the feedback terminal to the comparator. The control circuit is coupled to the comparator, and is configured to generate a control signal that turns on a high-side transistor, to open the switch prior to an edge of the control signal, and close the switch subsequent to the edge of the control signal.

In a further example, a switch-mode power supply includes an inductor, a high-side transistor, a low-side transistor, a voltage divider, a control circuit, a comparator, and a switch. The high-side transistor, the low-side transistor, and the voltage divider are coupled to the inductor. The control circuit includes a first output terminal coupled to the high-side transistor, and a second output terminal coupled to the low-side transistor. The comparator includes a first input terminal coupled to a reference voltage source, and an output terminal coupled to an input terminal of the control circuit. The switch includes a first terminal coupled to the voltage divider, a second terminal coupled to a second input terminal of the comparator, and a third terminal coupled to a third output terminal of the control circuit.

In a yet further example, an electricity meter includes metering circuitry and a switch-mode power supply. The switch-mode power supply is coupled to the metering circuitry, and includes an inductor, a high-side transistor, a low-side transistor, a voltage divider, a control circuit, a comparator, and a switch. The high-side transistor, the low-side transistor, and the voltage divider are coupled to the inductor. The control circuit includes a first output terminal coupled to the high-side transistor, and a second output terminal coupled to the low-side transistor. The comparator includes a first input terminal coupled to a reference voltage source, and an output terminal coupled to an input terminal of the control circuit. The switch includes a first terminal coupled to the voltage divider, a second terminal coupled to a second input terminal of the comparator, and a third terminal coupled to a third output terminal of the control circuit.

BRIEF DESCRIPTION OF THE DRAWINGS

For a detailed description of various examples, reference will now be made to the accompanying drawings in which:

FIG. 2 shows output switching coupling onto a feedback voltage in a switch-mode power supply circuit;

FIG. 3 shows sub-harmonic oscillation caused by output switching coupling onto a feedback voltage in a switch-mode power supply circuit;

FIG. 6 shows an example of blanking applied in the switch-mode power supply of FIG. 5 when the switching signal active time is longer than the blanking time;

FIG. 7 shows an example of blanking applied in the switch-mode power supply of FIG. 5 when the switching signal active time is shorter than the blanking time;

DETAILED DESCRIPTION

A switch-mode power supply operating in step-down mode includes a high-side transistor and a low side transistor coupled in series between a voltage input node and a ground node and joined at a switch node. An output circuit is coupled to the switch node for generating an output voltage based on a switching signal generated at the switch node. The switch-mode power supply also includes a feedback node configured to receive a feedback signal based on the output voltage. During operation, a control circuit of the switch-mode power supply generates a control signal to reciprocally switch the high-side transistor and low side transistor on and off, which generates the switching signal at the switch node. A ripple voltage that is generated based on the switching signal at the switch node is coupled onto the feedback signal. The switching signal is generated based on a difference between a reference voltage and the feedback signal combined with the ripple voltage.

Figure 1:
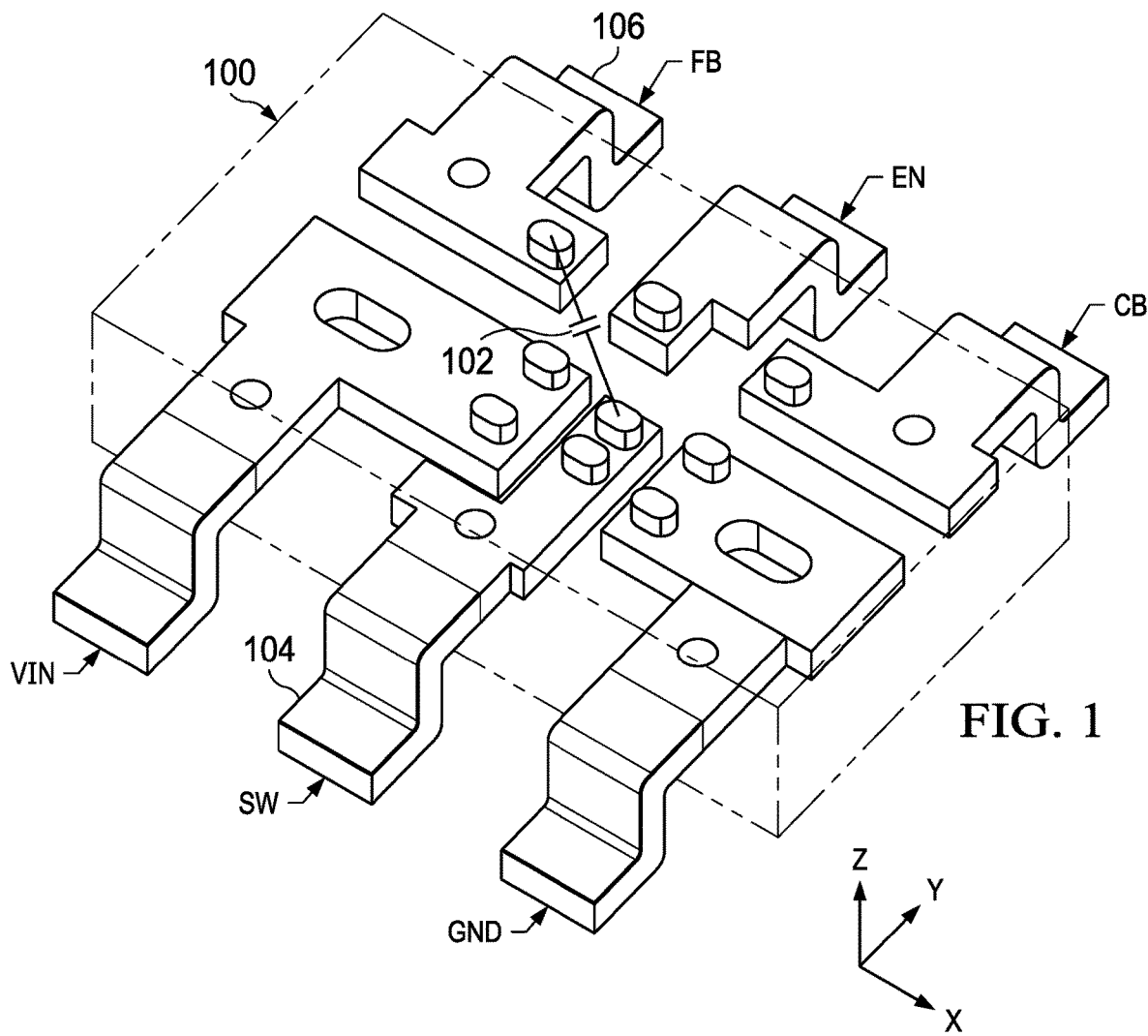
FIG. 1 shows an isometric perspective view of integrated circuit package suitable for use in a switch-mode power supply in accordance with this description.

As integrated circuits and integrated circuit packages become smaller the inter-pin spacing shrinks, which increases the parasitic capacitance between the pins. FIG. 1 shows an isometric perspective view of an integrated circuit package 100 suitable for use in a switch-mode power supply in accordance with this description. The integrated circuit package 100 includes a pin 104 for coupling the high-side transistor and the low-side transistor to an inductor, and a pin 106 for receiving a feedback voltage. Parasitic capacitance 102 is shown between the pin 104 and the pin 106. As the package size decreases the parasitic capacitance 102 increases and the coupling between the switching signal provided on the pin 104 and the feedback signal received at the pin 106 increases.

FIG. 2 shows coupling of a switching signal onto a feedback voltage in the integrated circuit package 100. The switching signal (not shown) is switching at a frequency of about 500 kilohertz. The switching produces about 250 millivolts of noise on the feedback signal 202 at the edges of the switching signal. The switching noise coupled to the feedback signal 202 produces an unexpected voltage ramp at the pin 106, which causes sub-harmonic oscillation and a shift in output voltage. FIG. 3 shows sub-harmonic oscillation caused by output switching coupling onto a feedback voltage in a switch-mode power supply circuit. In FIG. 3, the current 302 is the current flowing in the inductor of a switch-mode power supply. The switching signal 304 is provided at the pin 104 of the integrated circuit package 100, which is coupled to the inductor. The feedback signal 306 is proportional to the output voltage of the switch-mode power supply and includes switching noise at the edges of the switching signal 304. The internal feedback signal 308 is generated at an internal feedback node of circuitry disposed in the integrated circuit package 100 based on the feedback signal 306 after a low pass filter. An example low pass filter may include a 40 kiloohm resistor coupled to a 2 picofarad capacitor. The internal feedback signal 308 is disturbed by the switching noise even with low pass filtering. The switching noise in the internal feedback signal 308 causes subharmonic oscillation in the switch-mode power supply.

Figure 4:
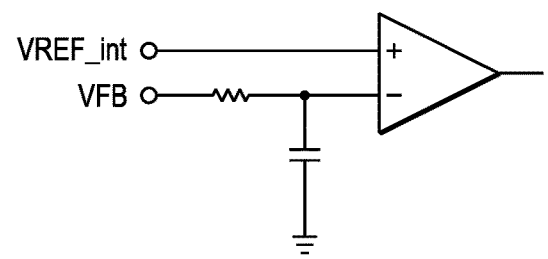
FIG. 4 shows an example low-pass filter applied to attenuate the effects of output switching coupling onto a feedback voltage in a switch-mode power supply circuit.

Some switch-mode power supplies attempt to reduce the effects of the cross-coupled switching noise by lowering the corner frequency of the low pass filter. FIG. 4 shows a low-pass filter applied to attenuate the effects of output switching coupling onto a feedback voltage in a switch-mode power supply circuit. However, lowering the corner frequency of the low pass filter reduces system bandwidth and transient performance, which is unacceptable in some applications.

Figure 5:
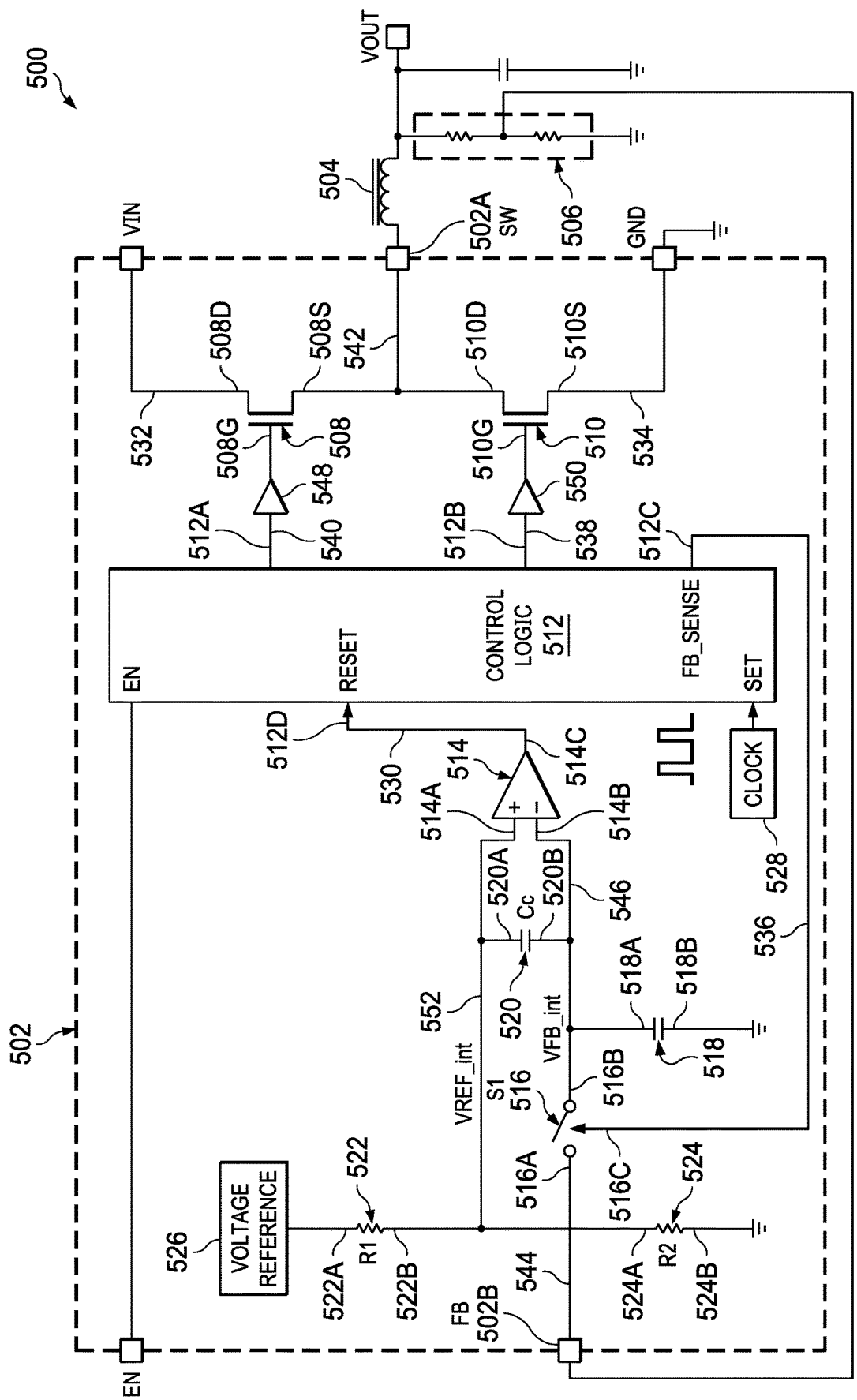
FIG. 5 shows a block diagram for an example switch-mode power supply that includes blanking to eliminate coupling of the output switching on the feedback voltage in accordance with this description.

FIG. 5 shows a block diagram for an example switch-mode power supply 500 that includes blanking to eliminate coupling of the output switching onto the feedback voltage. The switch-mode power supply 500 includes a switch-mode power supply circuit 502, an inductor 504, and a voltage divider 506. The switching terminal 502A is coupled to the inductor 504. The inductor 504 is coupled to the voltage divider 506 for dividing the output voltage of the switch-mode power supply 500 by a predetermined divisor to produce the feedback signal 544. The voltage divider 506 is coupled to the feedback terminal 502B to provide output voltage feedback to the switch-mode power supply circuit 502. The switch-mode power supply circuit 502 may implemented in the integrated circuit package 100 or similar package.

The switch-mode power supply circuit 502 includes a high-side transistor 508, a low-side transistor 510, a control circuit 512, a comparator 514, a switch 516, a capacitor 518, a capacitor 520, a resistor 522, a resistor 524, and a voltage reference circuit 526, and a clock generator 528. The clock generator 528 is coupled to the control circuit 512 and generates a clock signal. Activation of the clock signal causes the control circuit 512 to deactivate a control signal 538 and turn off the low-side transistor 510, and to activate a control signal 540 and turn on the high-side transistor 508. The comparator 514 is also coupled to the control circuit 512. The comparator 514 compares feedback from the voltage divider 506 to a reference voltage generated by the voltage reference circuit 526. Activation of the comparator output signal 530 causes the control circuit 512 to deactivate the control signal 540 and turn off the high-side transistor 508, and to activate the control signal 538 and turn on the low-side transistor 510.

The control circuit 512 includes an output terminal 512A and an output terminal 512B. The output terminal 512A is coupled to a gate terminal 508G of the high-side transistor 508 for turning the high-side transistor 508 on and off via the control signal 540. The output terminal 512B is coupled to a gate terminal 510G of the low-side transistor 510 for turning the low-side transistor 510 on and off via the control signal 538. A drain terminal 508D of the high-side transistor 508 is coupled to a power supply rail 532, and a source terminal 508S of the high-side transistor 508 is coupled to the switching terminal 502A for providing charging current to the inductor 504 when the high-side transistor 508 is on. A drain terminal 510D of the low-side transistor 510 is coupled to the switching terminal 502A and a source terminal 510S of the low-side transistor 510 is coupled to a common voltage source 534, such as ground, for discharging the inductor 504 when the low-side transistor 510 is on.

The comparator 514 includes an output terminal 514C coupled to an input terminal 512D of the control circuit 512 for provision of a result of comparing the reference signal 552 to the feedback signal 544. The comparator 514 also includes an input terminal 514A coupled to the voltage reference circuit 526 via the resistor 522 for receipt of a reference signal 552 to be compared to the feedback signal 544. The resistor 522 includes a terminal 522A coupled to the voltage reference circuit 526 and a terminal 522B coupled to the input terminal 514A of the comparator 514 for providing the reference signal 552 (which is derived from the output of the voltage reference circuit 526 to the comparator 514. The resistor 524 includes a terminal 524A coupled to the input terminal 514A of the comparator 514 and a terminal 524B coupled to a reference voltage source, such as ground for setting the voltage of the reference signal 522 in conjunction with the resistor 522. An input terminal 514B of the comparator 514 is coupled to the voltage divider 506 via the switch 516. The input terminal 514B is coupled to a terminal 516B of the switch 516 for receipt of the feedback signal 544 when the switch 516 is closed. A terminal 516A of the switch 516 is coupled to the voltage divider 506 via the feedback terminal 502B for providing the feedback signal 544 to the switch 516 and the comparator 514. A terminal 516C of the switch 516 is coupled to an output terminal 512C of the control circuit 512 for opening and closing the switch 516 relative to edges of the control signals 538 and 540 generated by the control circuit 512. A blanking control signal 536 generated by the control circuit 512 controls the switch 516.

The capacitor 518 is coupled to the comparator 514 and the switch 516, and the voltage across the capacitor 518 follows the voltage at the feedback terminal 502B when the switch 516 is closed. The capacitor 518 includes a terminal 518B coupled to ground, and a terminal 518A coupled to the input terminal 514B of the comparator 514 and the terminal 516B of the switch 516 for tracking the voltage of the feedback signal 544 when the switch 516 is closed and holding the voltage of the 544 when the switch 516 is open.

The capacitor 520 is coupled to the input terminal 514A and the input terminal 514B of the comparator 514, and forms a low pass filter circuit in conjunction with the resistor 522 and the resistor 524. A terminal 520A of the capacitor 520 is coupled to the input terminal 514A of the comparator 514, and a terminal 520B of the capacitor 520 is coupled to the input terminal 514B of the comparator 514 to provide a path for high-frequency signals between the input terminals 514A and 514B of the comparator 514. A pole frequency of the low pass filter circuit is defined as:

$$f_{pole} = \frac{1}{2\pi(R_1 // R_2)C_C}$$

where:
$R_1$ is the resistance of the resistor 522;
$R_2$ is the resistance of the resistor 524; and
$C_C$ is the capacitance of the capacitor 520.

The control circuit 512 deactivates the blanking control signal 536 to open the switch 516 while high-side transistor 508 or the low-side transistor 510 is transitioning between on and off states. For example, the control circuit 512 deactivates the blanking control signal 536 prior to deactivation of the control signal 540 and activates the blanking control signal 536 after subsequent activation of the control signal 538. Similarly, the control circuit 512 deactivates the blanking control signal 536 prior to deactivation of the control signal 538 and activates the blanking control signal 536 after subsequent activation of the control signal 540. Because the switch 516 is open during transitions at the switching terminal 502A, noise induced at the feedback terminal 502B by the transitions is not present at the input terminal 514B of the comparator 514. While the switch 516 is open, the capacitor 518 provides a sample of the feedback signal 544 at the at the input terminal 514B of the comparator 514. In some implementations of the 502, delay in the gate driver circuits 548 and 550 may ensure that that the switch 516 is open prior to transition of the switching signal 542. For example, if the control signal 540 is activated simultaneous with deactivation of the blanking control signal 536, then the switch 516 may open prior to switching of the high-side transistor 508 due to delay in the gate driver circuit 548.

FIG. 6 shows an example of blanking applied in the switch-mode power supply 500 when the active time of the switching signal 542 is longer than the blanking time. At 602, the control circuit 512 deactivates the blanking control signal 536 to open the switch 516. After the switch 516 is open, at 610, the control circuit 512 turns off the low-side transistor 510 and turns on the high-side transistor 508 to activate the switching signal 542 at the switching terminal 502A. A predetermined blanking time interval (Tblk) after 602 (after noise induced at the feedback terminal 502B by the transition of the switching signal 542 at 610 has settled), the control circuit 512 activates the blanking control signal 536 at 604 to close the switch 516.

At 606, the control circuit 512 deactivates the blanking control signal 536 to open the switch 516. After the switch 516 is open, at 612, the control circuit 512 turns off the high-side transistor 508 and turns on the low-side transistor 510 to deactivate the switching signal 542 at the switching terminal 502A. A predetermined blanking time interval after 606 (after noise induced at the feedback terminal 502B by the transition of the switching signal 542 at 612 has settled), the control circuit 512 activates the blanking control signal 536 at 608 to close the switch 516.

FIG. 7 shows an example of blanking applied in the switch-mode power supply 500 when the active time of the switching signal 542 is shorter than the blanking time. At 702, the control circuit 512 deactivates the blanking control signal 536 to open the switch 516. After the switch 516 is open, at 706, the control circuit 512 turns off the low-side transistor 510 and turns on the high-side transistor 508 to activate the switching signal 542 at the switching terminal 502A. At 708, the control circuit 512 turns off the high-side transistor 508 and turns on the low-side transistor 510 to deactivate the switching signal 542 at the switching terminal 502A. A predetermined blanking time interval after 708 (after noise induced at the feedback terminal 502B by the transitions of the switching signal 542 at 706 and 708 has settled), the control circuit 512 activates the blanking control signal 536 at 704 to close the switch 516.

Figure 8:
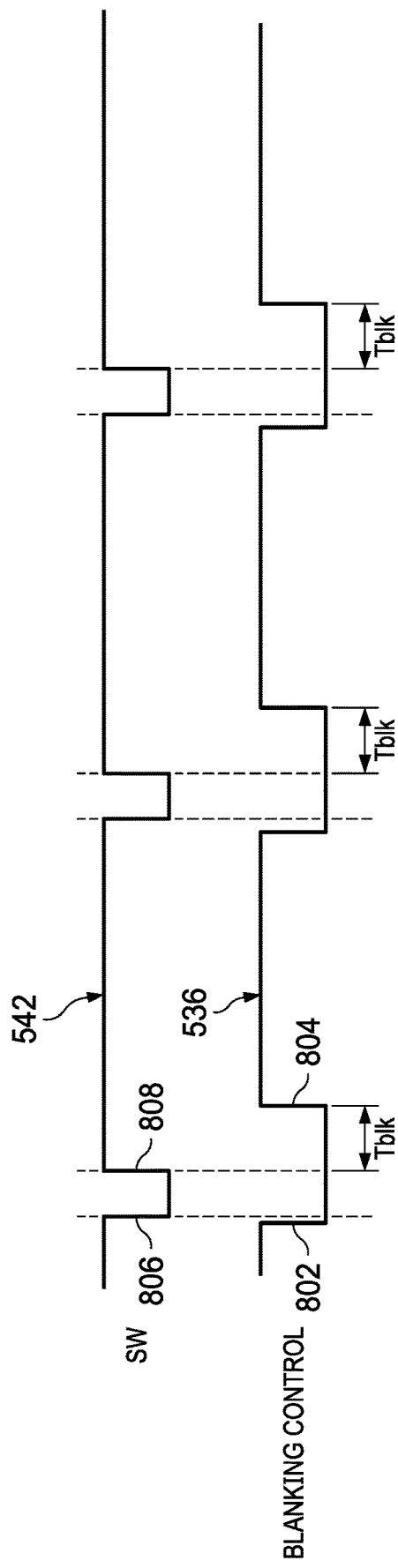
FIG. 8 shows an example of blanking applied in the switch-mode power supply of FIG. 5 when the switching signal inactive time is shorter than the blanking time.

FIG. 8 shows an example of blanking applied in the switch-mode power supply 500 when the inactive time of the switching signal 542 is shorter than the blanking time. At 802, the control circuit 512 deactivates the blanking control signal 536 to open the switch 516. After the switch 516 is open, at 806, the control circuit 512 turns off the high-side transistor 508 and turns on the low-side transistor 510 to deactivate the switching signal 542 at the switching terminal 502A. At 808, the control circuit 512 turns off the low-side transistor 510 and turns on the high-side transistor 508 to activate the switching signal 542 at the switching terminal 502A. A predetermined blanking time interval after 808 (after noise induced at the feedback terminal 502B by the transitions of the switching signal 542 at 806 and 808 has settled), the control circuit 512 activates the blanking control signal 536 at 804 to close the switch 516.

In the examples of FIGS. 6-8, the length of the blanking time interval is determined based on the settling time of the feedback signal at the feedback terminal 502B. For example, the blanking time interval may be longer than the settling time of the feedback signal at the feedback terminal 502B and short enough to ensure that the feedback signal can be sensed in a single cycle of the switch-mode power supply 500.

Figure 9:
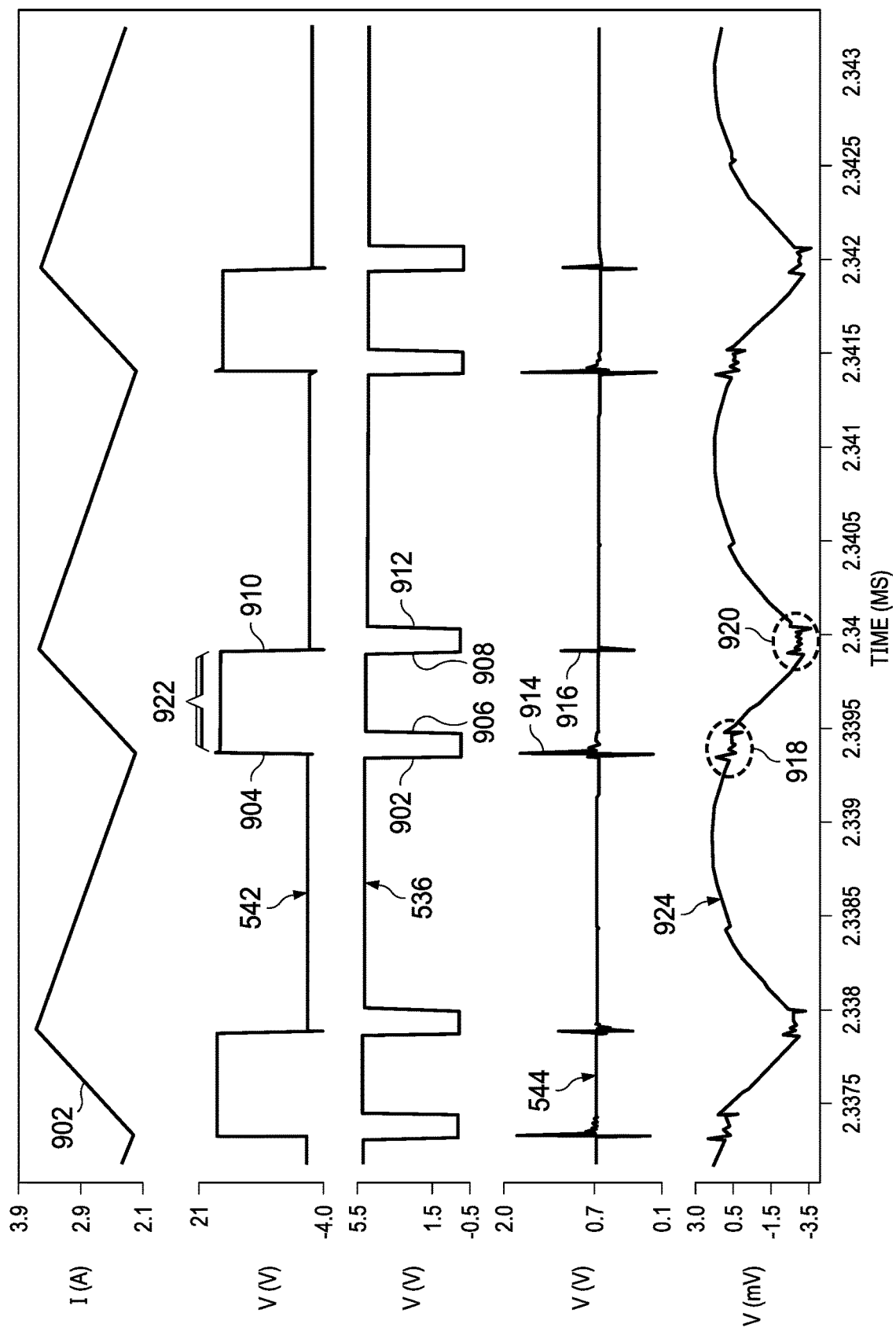
FIG. 9 shows example signals generated in the switch-mode power supply of FIG. 5.

FIG. 9 shows example signals generated in the switch-mode power supply 500. At 902, the control circuit 512 deactivates the blanking control signal 536 to open the switch 516. After the switch 516 is open, at 904, the control circuit 512 turns off the low-side transistor 510 and turns on the high-side transistor 508 to activate the switching signal 542 at the switching terminal 502A. Current 902 in the inductor 504 increases while the high-side transistor 508 is turned on (in the interval 922). A predetermined blanking time interval after 904 (after noise transient 914 induced in the feedback signal 544 at the feedback terminal 502B by the transition of the switching signal 542 at 904 has settled), the control circuit 512 activates the blanking control signal 536 at 906 to close the switch 516.

At 908, the control circuit 512 deactivates the blanking control signal 536 to open the switch 516. After the switch 516 is open, at 910, the control circuit 512 turns off the high-side transistor 508 and turns on the low-side transistor 510 to deactivate the switching signal 542 at the switching terminal 502A. A predetermined blanking time interval after 910 (after noise transient 916 induced at the feedback terminal 502B by the transition of the switching signal 542 at 910 has settled), the control circuit 512 activates the blanking control signal 536 at 912 to close the switch 516.

Because the switch 516 is open when the noise transients 914 and the 916 are present at the feedback terminal 502B, the noise transients 914 and 916 are not present on the internal feedback voltage 546 at the input terminal 514B of the comparator 514. The difference signal 924 represents the difference of the reference signal 552 at the input terminal 514A of the comparator 514 and the internal feedback voltage 546 at input terminal 514B of the comparator 514. In the difference signal 924, the noise transient 914 is not present in the interval 918, and the noise transient 916 is not present in the interval 920. Thus, the noise transients 914 and 916 do not cause subharmonic oscillation in the switch-mode power supply 500. Furthermore, ground noise caused parasitic inductance between a printed circuit board on which the switch-mode power supply circuit 502 is mounted and ground is attenuated.

The switch-mode power supply control circuitry described herein provides a number of advantages over other solutions. The blanking and filtering circuitry of the switch-mode power supply circuit 502 is relatively simple to implement, and effectively filters disturbances in the feedback signal 544 caused by transitions of the switching signal 542, while sensing the undisturbed feedback signal 544 when transient noise is not present. The switch-mode power supply circuit 502 does not sacrifice transient performance by lowing the corner frequency of a low pass filter applied to the feedback signal. Jitter performance is improved because when the switch 516 is open (during blanking time) the internal feedback voltage 546 is static. Implementations of the 500 are stable even with less than optimal printed circuit board (PCB) routing and implementation in small integrated circuit packages, which allows flexibility in packaging and PCB routing.

Figure 10:
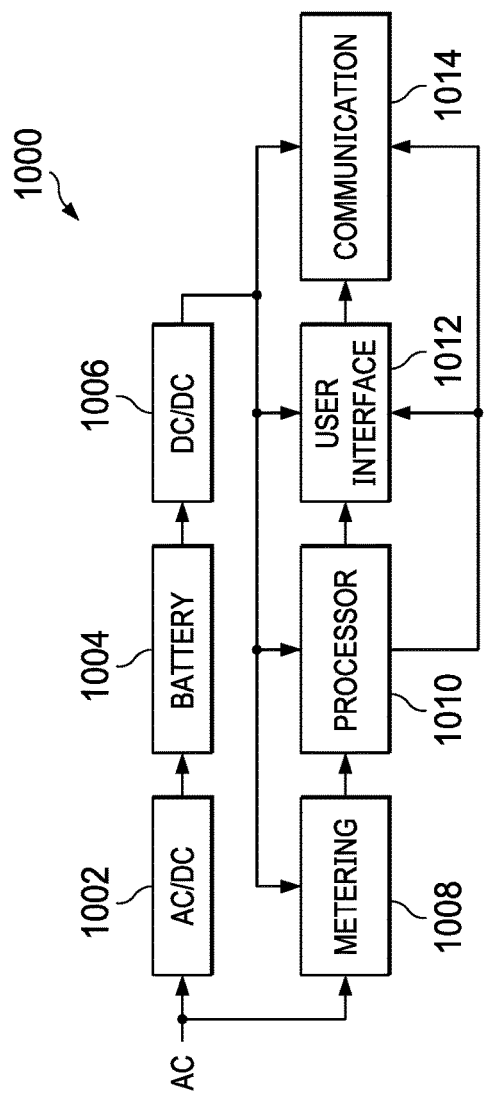
FIG. 10 shows a block diagram for an example electricity meter that includes a switch-mode power supply in accordance with this description.

FIG. 10 shows a block diagram for an example electricity meter 1000 that includes a switch-mode power supply in accordance with this description. The electricity meter 1000 is a smart meter that measures AC current drawn from the power mains and communicates the measurements to an electricity provider. The electricity meter 1000 includes an AC/DC converter 1002, battery circuitry 1004, a DC/DC converter 1006, metering circuitry 1008, a processor 1010, user interface circuitry 1012, and communication circuitry 1014. The AC/DC converter 1002 includes circuitry that converts AC voltage received from the power mains to DC voltage. The battery circuitry 1004 includes a battery and switching circuitry to switch output of the battery or the AC/DC converter 1002 to the DC/DC converter 1006.

The DC/DC converter 1006 generates one or more DC voltages, from the DC voltage received from the battery circuitry 1004, that power the metering circuitry 1008, the processor 1010, the user interface circuitry 1012, and the communication circuitry 1014. The metering circuitry 1008 includes circuitry, such as a current sensor and an analog-to-digital converter, that measures AC current drawn from the AC power mains by electrical equipment coupled to the electricity meter 1000. The metering circuitry 1008 passed current measurement values to the processor 1010. The processor 1010 includes a microcontroller or other instruction execution device that stores the measurement values and/or communicates the measurement values via the communication circuitry 1014 and/or the user interface circuitry 1012. The user interface circuitry 1012 may include a display device, such a liquid crystal display, and an input device, such as a keypad. The communication circuitry 1014 includes a wired (Universal Serial Bus, RS-232, etc.) and/or wireless communication circuitry that allows the processor 1010 to communicate the measurement values and other information to an electricity provider.

The DC/DC converter 1006 includes an implementation of the switch-mode power supply 500. The feedback blanking circuitry included in the switch-mode power supply circuit 502 allows integrated circuit package size to be reduced, which reduces size and cost of the electricity meter 1000 while eliminating sub-harmonic oscillation without sacrificing transient performance. Thus, the DC/DC converter 1006 can respond quickly to changes in the load current. Because the DC/DC converter 1006 is immune to transients coupled from the switching signal 542 to the feedback signal 544, PCB routing in the DC/DC converter 1006 and packaging of the electricity meter 1000 can be simplified.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

Modifications are possible in the described embodiments, and other embodiments are possible, within the scope of the claims.

What is claimed is:

1. A switch-mode power supply circuit, comprising:
   a control circuit having a control circuit input and having first, second and third control circuit outputs;
   a comparator having first and second comparator inputs and a comparator output, the first comparator input coupled to a reference voltage source, and the comparator output coupled to the control circuit input; and
   a switch having first and second switch terminals and a switch control terminal, the first switch terminal directly connected to a feedback terminal, the second switch terminal directly connected to the second comparator input, and the switch control terminal directly connected to the third control circuit output.

2. The switch-mode power supply circuit of claim 1, further comprising a capacitor coupled between the first comparator input and the second comparator input.

3. The switch-mode power supply circuit of claim 2, further comprising a resistor coupled between the reference voltage source and the second comparator input.

4. The switch-mode power supply circuit of claim 3, wherein the resistor is a first resistor, and the switch-mode power supply further comprises a resistor coupled between the first comparator input and a ground terminal.

5. The switch-mode power supply circuit of claim 1, further comprising a capacitor coupled between the second comparator input and a ground terminal.

6. The switch-mode power supply circuit of claim 1, further comprising:
- a first transistor having first and second transistor current terminals and a first control terminal, the first transistor current terminal coupled to a power supply terminal, and the first control terminal coupled to the first control circuit output; and
- a second transistor having third and fourth transistor current terminals and a second control terminal, the third transistor current terminal coupled to the second transistor current terminal, the fourth transistor current terminal coupled to a ground terminal, and the second control terminal coupled to the second control circuit output.

7. The switch-mode power supply circuit of claim 6, wherein the control circuit is configured to:
- provide a first control signal at the first control circuit output;
- provide a second control signal at the second control circuit output; and
- provide a third control signal at the third control circuit output, the third control signal causing the switch to open prior to a first edge of the first control signal, and the switch to close subsequent to the first edge.

8. The switch-mode power supply circuit of claim 7, wherein the third control signal causes the switch to open prior to a second edge of the second control signal, and to close subsequent to the second edge.

9. The switch-mode power supply circuit of claim 8, wherein the control circuit is configured to:
- cause the switch to open prior to the first edge and to close subsequent to the second edge.

10. A switch-mode power supply circuit, comprising:
- a control circuit having a control circuit input and having first, second and third control circuit outputs;
- a comparator having first and second comparator inputs and a comparator output, the first comparator input coupled to a reference voltage source, and the comparator output coupled to the control circuit input;
- a switch having first and second switch terminals and a switch control terminal, the first switch terminal directly connected to a feedback terminal, the second switch terminal directly connected to the second comparator input, and the switch control terminal directly connected to the third control circuit output; and
- wherein the control circuit is configured to:
  - provide a control signal at the first control circuit output that turns on a first transistor; and
  - provide a control signal at the third control circuit output to open the switch prior to an edge of the control signal at the first control circuit output and close the switch subsequent to the edge.

11. The switch-mode power supply circuit of claim 10, wherein the control circuit is configured to:
- provide a control signal at the second control circuit output that turns on a second transistor; and
- provide a control signal at the third control circuit output to open the switch prior to an edge of the control signal at the second control circuit output and close the switch subsequent to the edge; and
- close the switch subsequent to the edge of the control signal at the second control circuit output.

12. The switch-mode power supply circuit of claim 11, wherein the control circuit is configured to:

open the switch prior to the edge of the control signal at the first control circuit output; and
close the switch subsequent to the edge of the control signal at the second control circuit output.

13. The switch-mode power supply circuit of claim 10, further comprising a filter circuit configured to attenuate noise on a signal provided by the feedback terminal.

14. The switch-mode power supply circuit of claim 13, wherein the filter circuit includes:
- a capacitor coupled between the first comparator input and the second comparator input;
- a first resistor coupled the first comparator input and the reference voltage source; and
- a second resistor coupled between the first comparator input and a ground terminal.

15. The switch-mode power supply circuit of claim 10, including a capacitor coupled between the second comparator input and a ground terminal.

16. A switch-mode power supply, comprising:
- an inductor having first and second inductor terminals;
- a first transistor having a first transistor control terminal, and having a first current terminal coupled to the first inductor terminal;
- a second transistor having a second transistor control terminal, and having a second current terminal coupled to the first inductor terminal and to the first current terminal;
- a voltage divider coupled between the inductor and a ground terminal, and having a voltage divider output;
- a control circuit having a control circuit input and having first, second and third control circuit outputs, the first control circuit output coupled to the first transistor control terminal, and the second control circuit output coupled to the second control circuit output;
- a comparator having first and second comparator inputs and a comparator output, the first comparator input coupled to a reference voltage source, and the comparator output coupled to the control circuit input; and
- a switch having first and second switch terminals and a switch control terminal, the first switch terminal directly connected to the voltage divider output, the second switch terminal directly connected to the second comparator input, and the switch control terminal directly connected to the third control circuit output.

17. The switch-mode power supply of claim 16, including a capacitor coupled between the first comparator input and the ground terminal.

18. The switch-mode power supply of claim 16, including a capacitor coupled between the first comparator input and the second comparator input.

19. The switch-mode power supply of claim 18, including a resistor coupled between the reference voltage source and the first comparator input.

20. The switch-mode power supply of claim 19, wherein:
- the resistor is a first resistor; and
- the switch-mode power supply includes a second resistor coupled between the first comparator input and the ground terminal.

21. An electricity meter, comprising:
- metering circuitry; and
- a switch-mode power supply coupled to the metering circuitry, and including:
  - an inductor having first and second inductor terminals;
  - a first transistor having a first transistor control terminal, and having a first current terminal coupled to the first inductor terminal;

a second transistor having a second transistor control terminal, and having a second current terminal coupled to the first inductor terminal and to the first current terminal;

a voltage divider coupled between the inductor and a ground terminal, and having a voltage divider output;

a control circuit having a control circuit input and having first, second and third control circuit outputs, the first control circuit output coupled to the first transistor control terminal, and the second control circuit output coupled to the second control circuit output;

a comparator having first and second comparator inputs and a comparator output, the first comparator input coupled to a reference voltage source, and the comparator output coupled to the control circuit input; and a switch having first and second switch terminals and a switch control terminal, the first switch terminal directly connected to the voltage divider output, the second switch terminal directly connected to the second comparator input, and the switch control terminal directly connected to the third control circuit output.

* * * * *